5/31/83 XR 4,386,143

United States Patent [19]

[11] 4,386,143

Sato et al.

[45] May 31, 1983

[54] MULTICOLOR OPTICAL FILTERS AND PROCESS FOR PRODUCING THE SAME

[76] Inventors: Masamichi Sato; Kenji Matsumoto, both of No. 105, Oaza-mizonuma, Asaka-shi, Saitama, Japan

[21] Appl. No.: 211,538

[22] Filed: Nov. 26, 1980

Related U.S. Application Data

[63] Continuation-in-part of Ser. No. 52,704, Jun. 28, 1979, Pat. No. 4,271,246.

[30] Foreign Application Priority Data

Nov. 26, 1979 [JP] Japan ............................... 54-153358

[51] Int. Cl.[3] ............................................... G03F 5/00

[52] U.S. Cl. ....................................... 430/7; 430/364; 430/365; 430/376; 430/948; 430/952; 350/317

[58] Field of Search ..................... 430/7, 17, 364, 365, 430/366, 376, 948, 952, 4, 511; 350/316, 317

[56] References Cited

U.S. PATENT DOCUMENTS

| | | | |
|---|---|---|---|
| 2,186,730 | 1/1940 | Schneider | 430/365 |
| 2,628,902 | 2/1953 | Raibourn | 430/365 |
| 2,683,769 | 7/1954 | Banning | 430/24 |
| 2,704,252 | 3/1955 | Gresham | 430/7 |
| 2,820,090 | 1/1958 | Mountain | 350/317 |
| 3,486,895 | 12/1969 | Haugh | 430/952 |
| 3,592,649 | 7/1971 | Parsonage et al. | 430/321 |
| 3,955,983 | 5/1976 | Nakajima et al. | 430/364 |
| 4,081,277 | 3/1978 | Brault et al. | 430/320 |
| 4,271,246 | 6/1981 | Sato et al. | 430/27 |

*Primary Examiner*—J. Travis Brown
*Attorney, Agent, or Firm*—Sughrue, Mion, Zinn, Macpeak and Seas

[57] ABSTRACT

A low priced multicolor optical filter having optical black and a process for producing the same are disclosed; the filter comprising a base having thereon one black-and-white silver halide emulsion layer in which at least two color dye patterns and at least one optical black area comprising silver or silver and a dye are formed.

6 Claims, 11 Drawing Figures

MULTICOLOR OPTICAL FILTERS AND PROCESS FOR PRODUCING THE SAME

CROSS-REFERENCES TO RELATED APPLICATIONS

This is a continuation-in-part application of co-pending application Ser. No. 52,704, filed June 28, 1979 now U.S. Pat. No. 4,271,246.

BACKGROUND OF THE INVENTION

1. Field of the Invention

The present invention relates to multicolor optical filters and a process for producing the same, particularly, to multicolor optical filters for color camera tubes and a process for producing the same.

2. Development of the Invention

In single-tube or two-tube type color camera tubes, multicolor striped or multicolor mosaic optical filters have been used. While generally the multicolor optical filters comprise three colors: red, green and blue or cyan, magenta and yellow, which are regularly arranged to form a striped or mosaic pattern, the color system is not limited to these three colors and optical filters of two colors or four or more colors can also be utilized.

Hitherto known multicolor optical filters include, for example, those using a dichroic membrane as described in Japanese Patent Publication No. 8590/65 and Japanese patent application (OPI) No. 3440/77 (the term "OPI" as used herein refers to a "published unexamined Japanese patent application"), etc., and those wherein a high molecular weight material layer is colored with dyes as described in Japanese patent applications (OPI) Nos. 37237/72, 63739/73 and 66853/73 and Japanese Patent Publication No. 248/78, etc. However, processes for producing such filters are very complicated as they require the application of a photoresist for each respective color and pattern formation steps comprising imagewise exposure with correct mask arrangement, development, coloring or bleaching and removal of resists, which must be repeatedly carried out (generally, 3 or more times).

Further, in practice, various additional steps are required to obtain excellent multicolor optical filters, for example, in the case that a multicolor optical filter is produced by repeating the steps of application of a photoresist (such as bichromic acid-gelatin, etc.), imagewise exposure and relief pattern formation by development and coloring, it is necessary to insure that the color pattern formed in one stage does not discolor the color pattern of the next stage. For such purpose, it is necessary to apply a "noncoloring" protective layer to the surface of the pattern after each coloring stage, as described in Japanese patent application (OPI) No. 37237/72. Consequently, the production process becomes complicated and the resultant multicolor optical filter expensive.

Further, in multicolor optical filters for camera tubes, it is necessary to form a pure black pattern (so-called "optical black") in order to inspect the absolute zero value of input signals thereto, and chromium membrane patterns formed by a lithographic process have been used for optical black (referred to as "O.B." hereinafter) having a high optical density since such O.B. can be easily obtained if an evaporated or sputtered chromium layer is used.

In the following, an example of a typical process for producing a multicolor optical filter according to the prior art is illustrated with reference to drawings.

FIG. 1 illustrates a process for producing a multicolor optical filter having O.B. according to the prior art, where FIG. 1*a* to FIG. 1*e* illustrate forming O.B. on a base and FIG. 1*f* to FIG. 1*h* illustrate forming one color of the multicolor optical filter on the base on which O.B. was formed.

FIG. 1*a* shows a glass base 10 on which a thin chromium layer 11 is provided by vacuum evaporation or sputtering to have a high optical density; in FIG. 1*b* photoresist layer 12 has been applied to the thin chromium layer 11; in FIG. 1*c* photoresist layer 12 has been developed to form opening 14 and etching resist 13 after the photoresist layer 12 was exposed to light of the desired O.B. pattern; in FIG. 1*d* the chromium layer 11 has been removed under opening 14 by, for example, chemical etching to expose area of the glass base thereunder 15; in FIG. 1*e* O.B. 16 is formed by removing the photoresist.

After O.B. 16 was formed on the glass base 10 in the above manner, a multicolor optical filter is formed as now illustrated with reference to the case of dyeing bichromic acid-gelatin; in FIG. 1*f* a light sensitive hydrophilic polymer layer 17 (such as a bichromic acid-gelatin layer) is provided on the whole surface of the element; in FIG. 1*g* a striped relief pattern 18 of the hydrophilic polymer is formed by development after layer 17 is subjected to striped pattern exposure; in FIG. 1*h* stripe filter 19 is formed by dyeing the resultant relief with a dye.

Thus, a first color stripe filter having O.B. is obtained. After the first color stripe filter is formed, a water-impermeable protective layer is applied to prevent color mixing and the steps of FIG. 1*f* to FIG. 1*h* repeated to form a multicolor optical filter.

Such a process for producing a multicolor optical filter for camera tubes has the drawback that the multicolor optical filter is expensive because a lithographic process is required to form O.B. of a thin chromium layer in addition to the above described complicated color pattern forming steps.

The present inventors have developed a process which comprised using a known prior photographic material having a black-and-white silver halide emulsion layer in combination with a color development process using a coupler-containing developer, whereby multicolor optical filters are easily produced at low cost as compared with the prior art multicolor optical filters, which process was proposed in co-pending application Ser. No. 52,704, filed June 28, 1979.

SUMMARY OF THE INVENTION

An object of the present invention is to provide an improved process for producing optical filters and to provide low-priced optical filters, whereby O.B. can be very simply obtained.

Such object is attained by:

(1) Multicolor optical filters composed of a photographic material comprising one black-and-white silver halide emulsion layer on a base, wherein at least two color dye patterns are formed in said emulsion layer and an optical black composed of silver or silver and a dye is formed in said emulsion layer;

(2) A process for producing multicolor optical filters which comprises:

exposing a photographic material comprising one black-and-white silver halide emulsion layer on a base to light to carry out pattern exposure for the first desired color;

forming a pattern containing a dye to yield the first desired color and silver by color development using a coupler-containing developer;

bleaching silver in said pattern to remove the same by dissolution or to convert said silver into a silver compound;

carrying out pattern exposure for the second desired color, forming a pattern containing a dye to yield the second desired color and silver, and bleaching silver in said pattern to remove the same by dissolution or converting said silver into silver compound;

repeating, if desired, the same steps for forming a pattern containing a dye to yield third or subsequent colors and silver, to thereby form patterns of at least two colors in said emulsion layer; and finally carrying out pattern exposure corresponding to an optical black, carrying out black-and-white development or color development using a coupler-containing developer, and fixing to form an optical black composed of silver or silver and the dye resulting from the coupler.

(3) A process for producing multicolor optical filters which comprises:

exposing a photographic material comprising one black-and-white silver halide emulsion layer on a base to light to carry out pattern exposure for the first desired color;

forming a pattern containing a dye to yield the first desired color and silver by color development using a coupler-containing developer;

carrying out pattern exposure for the second desired color, forming a pattern containing a dye to yield the second desired color and silver;

repeating, if desired, the same steps for forming a pattern containing a dye to yield third or subsequent colors and silver;

bleaching silver in the patterns to remove the same by dissolution or to convert (rehalogenate) said silver into a silver compound, to thereby form patterns of at least two colors in said emulsion layer; and finally carrying out pattern exposure corresponding to an optical black, carrying out black-and-white development or color development using a coupler-containing developer, and fixing to form an optical black composed of silver or silver and the dye resulting from the coupler.

BRIEF DESCRIPTION OF THE DRAWINGS

FIG. 1 gives an example of a process for producing multicolor optical filters according to the prior art, wherein

FIG. 2 shows an example of a process for producing multicolor optical filters per the present invention, wherein

DETAILED DESCRIPTION OF THE INVENTION

One example of a process for producing the multicolor optical filters of the present invention will firstly illustrated with reference to FIG. 2.

Figure 1A:
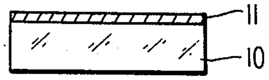
FIG. 1*a* to FIG. 1*e* illustrate forming an optical black on a base and FIG. 1*f* to FIG. 1*h* illustrate forming one color of the multicolor optical filter.
Figure 1B:
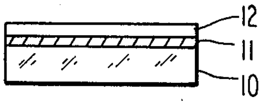
Figure 1C:
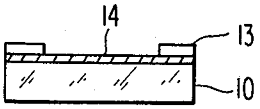
Figure 1D:
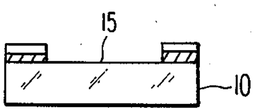
Figure 1E:
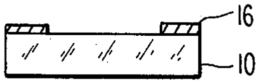
Figure 1F:
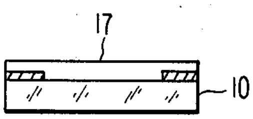
Figure 1G:
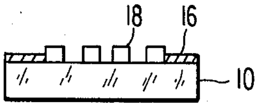
Figure 1H:
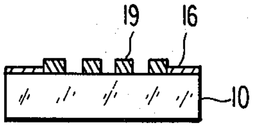
Figure 2A:
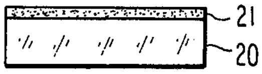
FIG. 2*a* shows a photographic material used in the present invention.

FIG. 2*a* shows a photographic material used in the present invention wherein a photographic material comprising a black-and-white silver halide emulsion layer 21 on a base 20 is used.

Figure 2B:
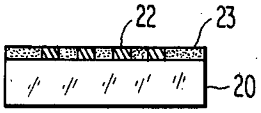
FIG. 2*b* illustrates forming one color of the multicolor optical filter.
Figure 2C:
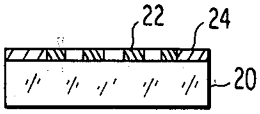
FIG. 2*c* illustrates forming the optical black where the numerals represent: 20—base; 21—silver halide emulsion layer; 22—color pattern; 24—optical black.

After the emulsion layer 21 is subjected to striped pattern exposure as shown in FIG. 2*b*, a first color stripe filter 22 is formed by carrying out color development for the desired first color using a coupler-containing developer and thereafter bleaching silver. The same procedure is carried out for the desired second color, etc., to form the multicolor stripe filter. In FIG. 2*b*, 23 represents unexposed areas of the emulsion layer where silver halide remains. After unexposed areas 23 of the photographic material are subjected to pattern exposure for O.B. as shown in FIG. 2*c*, they are developed by black-and-white development or color development using a coupler-containing developer and fixed to yield multicolor optical filter on which O.B. 24 is formed.

According to the present invention, it is thus possible to easily obtain multicolor optical filters having an O.B. as compared with the prior process shown in FIG. 1.

The process of the present invention will now be illustrated in greater detail with reference to FIG. 2.

As shown in FIG. 2*a*, the photographic material used in the present invention comprises a black-and-white emulsion layer 21 provided on base 20 or on a subbing layer, if desired or necessary, provided on base 20. The base 20 should be transparent in the case that it is used itself as the base for the optical filter. However, the base may be translucent or opaque in the case that a color filter layer formed on said base is transferred to another transparent base. The base may have any form, such as plate, sheet or film form. The base may be a plastic such as polyethylene terephthalate, polystyrene, polycarbonate or cellulose acetate, etc., glass, quartz, sapphire, etc. Further, the base itself may have other uses, for example, it may function as the front glass plate of a camera tube.

The subbing layer used as occasion demands is a layer which firmly adheres to both base 20 and silver halide emulsion layer 21. Illustrative materials for the subbing layer include gelatin, albumin, casein, cellulose derivatives, starch derivatives, sodium alginate, polyvinyl alcohol, polyvinylpyrrolidone, acrylic acid copolymers, polyacrylamide, etc. The thickness of the subbing layer is preferred to be as low as practical, typically in the range of 0.01 to 1 μm, preferably 0.05 to 0.5 μm.

As the silver halide emulsion directly applied to the base or via the subbing layer, though known silver halide emulsions obtained by dispersing silver halide in a water-soluble hydrophilic binder may be used, it is particularly preferred for the present invention to use fine grain emulsions, for example, Lippmann emulsions in which the average particle size of the silver halide is 0.1 μm or less. The ratio by weight of the silver halide to the water-soluble hydrophilic binder is usually in the range of about 1:6 to about 8:1.

As the silver halide, there may be used silver chloride, silver bromide, silver iodide, silver chlorobromide, silver iodobromide, silver chloroiodide and silver chloroiodobromide, etc.

As the water-soluble binder, there may be used gelatin, albumin, casein, cellulose derivatives, agar, sodium alginate, sugar derivatives, polyvinyl alcohol, polyvinylpyrrolidone, polyacrylamide and the like. If desired or necessary, a compatible mixture of two or more of such binders may be used.

The thickness of the silver halide emulsion layer after drying is preferred to be in the range of about 0.8 to about 10 μm.

A layer for antihalation may be provided, if desired or necessary, on the back of the base of the photographic material.

This photographic material is subjected to imagewise exposure through, for example, a photomask in a pattern corresponding to the first desired color pattern of the multicolor optical filter, for example, a striped or mosaic pattern of cyan color. Known photomasks can be used. For example, a chromium mask can be used where chromium forming a light intercepting pattern is provided on a glass plate and a transparent image pattern corresponding to said first desired color pattern is also formed thereon.

As the light source used for this exposure, any may be used which emits light having a wavelength(s) to which the silver halide emulsion layer is sensitive; a light source emitting white light is typically used. The method of exposure may be close contact exposure where light is uniformly applied to the photomask placed on the emulsion layer or projection exposure where imagewise exposure is carried out through a lens system.

The photographic material, after exposure, is then subjected to following first color development using a coupler-containing developer. For example, such a photographic material can be developed with a cyan coupler-containing color developer, whereby a pattern composed of a cyan dye and silver particles is formed in the exposed areas.

After conclusion of first development, the photographic material is then processed to bleach silver particles of the pattern. In order to bleach the silver particles, a solution which destroys the latent image but does not dissolve silver halide in unexposed areas and does not destroy the dye is used; such solution can be selected from known reducers or bleaching solutions, such as an aqueous solution of an alkali metal or ammonium bichromate and sulfuric acid or an aqueous solution of a ferricyanide compound (e.g., potassium ferricyanide, sodium ferricyanide, etc.) and potassium bromide, etc. As a result, silver which can function as development nuclei will not be present in the first color pattern because the silver particles formed by color development or undeveloped silver nuclei are removed by dissolution or destroyed by rehalogenation. Accordingly, unless imagewise exposure is again applied to the pattern, dyes of the second and third color formed in subsequent steps will not be formed in the first color pattern, and, consequently, color mixing does not occur in the first color pattern.

In the case of forming the second color pattern or patterns of 3 or more colors, the same step is repeated after color development for the second color or subsequent colors, whereby the resulted pattern does not include mixed colors.

In the present invention, in the case of producing a crossing type multicolor optical filter where, for example, cyan, yellow, green and transparent patterns are formed by crossing a cyan stripe pattern with a yellow stripe pattern, bleaching after formation of the first color pattern is preferably carried out using a bleaching solution which rehalogenates silver particles contained in said pattern.

Then, imagewise exposure of a pattern corresponding to the second color, for example, a magenta pattern, is similarly carried out using a second photomask. This imagewise exposed area may be an unexposed area adjacent cyan color pattern 22 shown in FIG. 2b or may be an area containing the cyan color pattern 22 as the above described crossing type optical filter. The photographic material, after conclusion of exposure, is then subjected to second color development with a coupler-containing developer. For example, the photographic material can be developed using a magenta coupler-containing color developer, whereby pattern 22 containing the previously formed cyan dye and a pattern composed of magenta dye and silver particles are formed. After conclusion of second development, the silver particles in the photographic material are bleached in the same manner as described above.

Imagewise exposure of a pattern corresponding to a third desired color, for example, a yellow color pattern, is carried out in a similar manner, and the photographic material developed with, for example, a yellow coupler-containing color developer to form a pattern composed of a yellow dye and silver particles. The silver particles are then bleached in the same manner as described above.

Alternatively, the photographic material is subjected to the same processings as described above, except that the bleaching step after each color development is not performed. Thereafter, silver particles formed in each color pattern are all at once bleached by dissolution or converting the silver into a silver compound, whereby patterns of at least two colors are formed. In the case, however, the following problems arise. That is, the processing time tends to be too long because the color development generally proceeds slowly, and development does not quickly reach a saturation point. The development can be saturated by extending development to 30 or 40 minutes in each development step, but for processing a plurality colors, the overall processing time becomes extremely long. Further, if the first color (e.g., cyan) development time is limited to 15 minutes to shorten the developing time, during the second color (e.g., magenta) development the magenta dye will form in the first color pattern which should consist only of cyan dye. Thus, the cyan pattern becomes a mixture of the cyan and magenta. Such a mixed color is generally not desirable.

In order to avoid the problems in the latter process, it is preferred that development of the first color is stopped as soon as a suitable color density is obtained (e.g., after 15 minutes) and then rapid black-and-white development is carried out. As a result, undeveloped latent image remaining in the area of the first color is developed by this rapid black-and-white developing agent in a short period of time (about 5 minutes at the longest). Thus, development saturation is quickly reached, and active silver no longer exists in the exposed area. Color development in the first color pattern will not substantially proceed any further and the second color (magenta dye) and the third color (yellow dye) cannot form in the first color pattern. When a three or more color pattern is to be formed, formation of mixed color patterns can be prevented by repeating the same step after the second and subsequent color development steps.

It is necessary that the black-and-white developing solution used for the above purpose should have a developing speed at faster than that of the color developer solution. Black-and-white developing agents well known in the art can be used for this purpose. For example, those used for forming O.B. described hereafter can be used. Rapid developer solutions or high contrast developer solutions known in the field of photography are most preferred for such a purpose. The rapid developer solutions and the high contrast developer solutions are described, for example, in *Manual of Scientific Photography,* Second Volume, new edition, published Dec. 20, 1959 by Maruzen Co., Ltd., pp. 126 and 127.

The coupler-containing color developer used in the present invention is an aqueous alkali solution (pH 8 or more, preferably pH 9–12) containing one or more p-phenylenediamines, for example, N,N-diethyl-p-phenylenediamine sulfate or N,N-diethyl-3-methyl-p-phenylenediamine hydrochloride, etc., which yield a color product by reaction of the oxidation product thereof with a color former (color coupler), which compounds are well known as developing agents. This aqueous alkali solution generally contains other salts such as sodium sulfite, etc., pH controllers or buffering agents such as sodium hydroxide, sodium carbonate or sodium phosphate, etc., and conventional antifogging agents such as alkali halides such as potassium bromide, etc. Addition of an antifoggant to the color developer is the most preferred embodiment of the present invention.

Examples of couplers contained in each color developer include yellow couplers as described in U.S. Pat. Nos. 3,510,306 and 3,619,189 and Japanese Patent Publication Nos. 33775/65 and 3664/69, etc., magenta couplers as described in German patent application (OLS) No. 2,016,587, U.S. Pat. Nos. 3,152,896 and 3,615,502, and Japanese Patent Publication No. 13111/69, etc., and cyan couplers as described in U.S. Pat. Nos. 3,002,836 and 3,542,552 and British Pat. No. 1,062,190, etc.

Although known cyan, magenta and yellow couplers are described in the above, couplers for other colors can be, of course, used in the color developer of the present invention. Further, the order of color development may be freely varied from the above sequence.

As a processing solution used prior to color development, a prehardening bath (an aqueous solution containing aldehydes having the function of hardening, for example, gelatin as a constitutional component of the photographic emulsion by reacting therewith) are often used.

After forming the multicolor pattern wherein a cyan dye containing pattern, a magenta dye containing pattern and a yellow dye containing pattern are regularly arranged, O.B. is formed as shown in FIG. 2*c*.

In the present invention, O.B. is formed by black-and-white development or color development using a coupler-containing developer after unexposed area 23 (shown in FIG. 2*b*) of a photographic material on which a multicolor filter is formed is exposed to light of the desired O.B. pattern by the same method as used for each color pattern. Optical density of the O.B. is generally not less than 1.5, preferably 3.0 or more and more preferably 3.5 or more.

The black-and-white developing agent used in the present invention includes those generally known in the art, examples of which include hydroquinone, pyrogallol, 1-phenyl-3-pyrazolidone, p-aminophenol, ascorbic acid, etc. It is possible to add to the developing solution, if desired or necessary, known compounds or compositions, such as alkali agents (for example, sodium hydroxide and sodium carbonate), pH controlling or buffer agents (for example, acetic acid and boric acid), antifogging agents (for example, potassium bromide) and preservatives (for example, sodium sulfite), etc., in conventional amounts.

Further, in a coupler-containing color developer used for the formation of O.B., the above described couplers can be used alone or as a mixture thereof. A coupler-containing color developer used for forming O.B. must yield a dye image by color development of high density and the density due to silver particles must be high. These requirements can be obtained by suitably selecting, for example, the kind of coupler(s), color developing agent(s) or auxiliary developing agent(s), etc.

In the case of carrying out black-and-white development in order to obtain O.B., O.B. 24 in FIG. 2*c* comprises silver, which can be increased in optical density to visible light to a value more than 3.5 only with difficulty. However, in the case of carrying out color development using a coupler-containing developer(s) an optical density of 3.5 or more can easily be obtained. Accordingly, formation of O.B. by color development using a coupler-containing developer(s) is a particularly excellent embodiment of the present invention. In the case of carrying out black-and-white development, optical density is often less than 3.5, but such may be used as it is or be intensified by known methods such as a noble metal intensification to increase the optical density to 3.5 or more.

The photographic material on which O.B. is formed is then fixed to remove silver halide particles in unexposed areas and/or in color patterns, whereby a multicolor optical filter having O.B. as shown in FIG. 2*c* is produced.

As fixing agents used for such step, it is possible to use known conventional silver halide solvents (for example, sodium thiosulfate and sodium thiocyanate). The solution containing the fixed agent may contain, if desired or necessary, preservatives (for example, sodium sulfite), pH controlling agents (for example, acetic acid) or chelating agents, etc.

In the case that the multicolor optical filter obtained per the present invention is in the form of a circular glass plate for use as the front plate of camera tubes, it can be used as it is. In the case that the base is a film or a thin glass plate (for example, 0.1 to 0.2 mm thick), it can be used by bonding the same to a circular glass plate using, for example, epoxy conventional adhesive.

As a further embodiment of the present invention, it is possible to use a photographic material comprising a silver halide emulsion layer on a base which has been processed to have a lubricant surface as described in, for example, Japanese Patent Application (OPI) No. 132930/74, whereby said emulsion layer is transferred on a circular glass plate for use as the front plate of a camera tube after a multicolor optical filter having O.B. is formed in said emulsion layer by the above described process.

As illustrated above, according to the process of the present invention, a multicolor optical filter is formed using a known photographic material having a black-and-white silver halide emulsion layer by repeating a plurality of imagewise exposures, color developments with a coupler-containing developer and bleaching to form the desired color patterns in the same emulsion layer, and then O.B. is formed in the same emulsion layer by a photographic process as described above. Therefore, the process of the present invention is quite different from conventional color photographic processes where a multicolor optical filter is obtained with using a coupler-free or coupler-containing color film comprising a plurality of emulsion layers each having a different spectral sensitivity by carrying out color formation to form different colors in each emulsion layer. Thus, in multicolor optical filters formed per the present invention, a line width of 1 μm can be easily obtained with high precision.

Further, according to the present invention low cost multicolor optical filters can be obtained, because not only is each color pattern easily obtained as compared to known processes, for example, using dichroic layer or using a high molecular weight material layer colored with a dye, but also O.B. which was hitherto formed by a lithographic process can be formed in the same emulsion layer by a simple process.

The following Examples illustrate the present invention in greater detail.

EXAMPLE 1

Using 50 g of gelatin and 188 g of silver bromide, 1,400 ml of a silver bromide emulsion (average grain size about 0.06 μm) was prepared in a customary manner. To the resulting emulsion was added 0.25 g of 4-methyl-2,3-diethoxythiazolocarbocyanine iodide to sensitize the emulsion optically so that it had sensitivity to light of wavelengths of 510 nm to 530 nm. The emulsion was coated on a circular borosilicate glass plate having a diameter of 1 inch and a thickness of 2.5 mm to a dry thickness of about 3 μm, and dried to afford a photographic material. The photographic material was brought into intimate contact with a chromium mask for a stripe filter having a transparent stripe with a width of 20 μm and a pitch of 60 μm, and exposed to glow light (tungsten-filament lamp). The exposed photographic material was dipped for 2 minutes in a 5% aqueous solution of formaldehyde to preharden it, washed with water for 3 minutes, and developed at 24° C. for 10 minutes with a cyan color developer solution having the following formulation.

| Cyan Color Developer Solution | |
|---|---|
| Diethyl-p-phenylenediamine Hydrochloride | 3 g |
| Sodium Sulfite | 5 g |
| Sodium Carbonate | 60 g |
| Potassium Bromide | 2 g |
| Water to make | 1 l |

To the developer solution was added 50 ml of methanol having 1 g of m-hydroxybiphenyl dissolved in it.

The developed photographic material was washed with water for 5 minutes, and developed at 24° C. for 5 minutes with a developer of the following formulation to saturate the development of the exposed portion (to inhibit further progress of the development).

| Developer | |
|---|---|
| 1-Phenyl-3-pyrazolidone | 0.5 g |
| Sodium Sulfite (anhydrous) | 50 g |
| Hydroquinone | 12 g |
| Sodium Carbonate Monohydrate | 60 g |
| Potassium Bromide | 2 g |
| Benzotriazole | 0.2 g |
| 1-Phenyl-5-mercaptotetrazole | 5 mg |
| Phenazine-2-carboxylic Acid | 1 g |
| Water to make | 1 l |

Then, the photographic material was dipped for 2 minutes in a stop bath of the following formulation, washed with water for 5 minutes, and then dried thereby to obtain a pattern of a mixture of cyan dye and silver.

| Stop Bath | |
|---|---|
| 28% Acetic Acid | 32 ml |
| Sodium Sulfate | 45 g |
| Water to make | 1 l |

Then, the same chromium mask as above was used, and positioned so that its transparent portion was located immediately adjacent the above cyan pattern, and the photographic material was exposed in the same way as above, and developed at 24° C. for 10 minutes with a magenta color developer solution of the following formulation.

| Magenta Color Developer Solution | |
|---|---|
| Sodium Sulfite | 5 g |
| Diethyl-p-phenylenediamine Hydrochloride | 3 g |
| Sodium Carbonate | 60 g |
| Potassium Bromide | 2 g |
| Water to make | 1 l |

To the developer solution was added 50 ml of methanol having 1 g of 1-phenyl-3-methyl-5-pyrazolone dissolved in it.

The developed photographic material was washed with water for 5 minutes, and then developed at 24° C. for 5 minutes with the aforesaid black-and-white developer to saturate the development of the exposed area.

The developed material was dipped in the same stop bath as used in cyan development, washed with water for 5 minutes, and dried. Thus, magenta stripe was obtained adjacent the cyan stripe.

The same chromium mask as above was used, and positioned so that the transparent portion of the mask was located adjacent the magenta pattern. The photographic material was exposed, and developed at 24° C. for 10 minutes with a yellow color developer solution of the following formulation.

| Yellow Color Developer Solution | |
|---|---|
| Sodium Sulfite | 5 g |
| Diethyl-p-phenylenediamine Hydrochloride | 3 g |
| Sodium Carbonate | 60 g |
| Potassium Bromide | 2 g |
| Water to make | 1 l |

To the developer solution was added 50 ml of methanol having dissolved 1 g of p-nitroacetanilide in it.

The developed photographic material was washed with water for 5 minutes, dipped for 2 minutes in a bleach solution of the following formulation, and washed with water for 1 minute and dried.

| Bleach Solution | |
|---|---|
| Potassium Ferricyanide | 100 g |
| Potassium Bromide | 30 g |
| Water | 1,000 ml |

The photographic material was then brought into intimate contact with a chromium mask for optical black having a transparent portion of 1.5 mm×8 mm such that the transparent portion was located immediately adjacent the above color stripe area, and exposed to glow light (tungsten-filament lamp). The exposed photographic material was developed at 24° C. for 3 minutes with a mixture of 1 l of a magenta color developer "LDC-MI" (a product of Fuji Photo Film Co., Ltd.) and 1 l of a yellow color developer "LDC-YI" (a product of Fuji Photo Film Co., Ltd.). The developed photographic material was washed with water for 5 minutes, followed by treatment with a fixation bath of the following formulation at 20° C. for 2 minutes.

| Fixing Bath | |
|---|---|
| Sodium Thiosulfate | 240 g |
| Sodium Sulfite | 3 g |
| Glacial Acetic Acid | 5 ml |
| Potassium Alum | 6 g |
| Water | 1,000 ml |

The photographic material was then washed for 5 minutes, and dried to obtain a color stripe filter of cyan, magenta and yellow with a width of 20 μm, having optical black composed of magenta, yellow and silver. Optical density of the optical black was about 4.5.

EXAMPLE 2

The same photographic material as in Example 1 was exposed and pre-hardened in the same way as in Example 1, and then developed with a cyan color developer "LDC-CI" (a product of Fuji Photo Film Co., Ltd.) for 3 minutes at 24° C. The developed material was washed with water for 2 minutes, and processed for 2 minutes with a bleach solution of the following formulation to remove the undeveloped latent image in the silver halide emulsion layer.

| Bleach Solution | |
|---|---|
| Potassium Bichromate | 1 g |
| Sulfuric Acid | 1 ml |
| Water | 1,000 ml |

The processed photographic material was washed with water for 4 minutes, and dried. Then, it was subjected to the same second exposure as in Example 1, and developed with a magenta color developer "LDC-MI" (a product of Fuji Photo Film Co., Ltd.) at 24° C. for 3 minutes. The developed material was washed with water for 2 minutes, processed for 2 minutes with the above bleach solution, washed with water for 4 minutes, and dried.

The photographic material was then subjected to the same third exposure as in Example 1, and developed with a yellow color developer "LDC-YI" (a product of Fuji Photo Film Co., Ltd.) at 24° C. for 3 minutes. The developed photographic material was washed with water for 2 minutes, bleached for 2 minutes with a bleach agent "LDC-BI" (a product of Fuji Photo Film Co., Ltd.), washed with water for 1 minute and dried.

Thereafter, the photographic material was subjected to the same exposure for optical black as in Example 1, and developed at 20° C. for 3 minutes with a black-and-white developer of the following formulation.

| Black-And-White Developer Solution | |
|---|---|
| Sodium Sulfite (anhydrous) | 90 g |
| Hydroquinone | 45 g |
| Potassium Bromide | 30 g |
| Sodium Hydroxide | 37.5 g |
| Water to make | 1 l |

The developed photographic material was then processed at 20° C. for 2 minutes with the same fixation bath as in Example 1, washed with water for 5 minutes, and dried. Thus, a 3-color striped filter of cyan, magenta and yellow without mixed color was obtained. Optical density of the resulting optical black was about 4.5.

While the invention has been described in detail and with reference to specific embodiments thereof, it will be apparent to one skilled in the art that various changes and modifications can be made therein without departing from the spirit and scope thereof.

What is claimed is:

1. A multicolor optical filter comprising one hydrophilic binder layer resulting from fixation of a black-and-white silver halide emulsion layer on a base, wherein at least two color dye patterns are formed in said binder layer, which color dye patterns are free of silver and silver halide, and at least one optical black area comprising silver or silver and a dye formed in said one binder layer, which at least one optical black area is separate and distinct from said at least two color dye patterns.

2. A multicolor optical filter of claim 1, wherein said filter consists essentially of a base having thereon a subbing layer and said one hydrophilic binder layer resulting from fixation of a black-and-white silver halide emulsion layer on said subbing layer.

3. A multicolor optical filter of claim 1, wherein said emulsion layer is a Lippmann emulsion.

4. A multicolor optical filter of claim 1, wherein said optical black has a optical density of 3.5 or more.

5. A process for producing a multicolor optical filter which comprises:

exposing to light a photographic material comprising one black-and-white silver halide emulsion layer on a base to perform pattern exposure for a first color;

forming a pattern containing a dye of the first color and silver by color development using a coupler-containing developer;

bleaching silver in said pattern to remove the same by dissolution or to convert said silver into a silver compound;

carrying out pattern exposure for a second color, forming a pattern containing a dye of the second color and silver, and bleaching silver in said pattern to remove the same by dissolution or to convert said silver into a silver compound;

repeating, if desired, the same steps for forming a pattern containing dyes of third and subsequent colors, to thereby form patterns of at least two colors in said emulsion layer; and finally carrying out pattern exposure corresponding to a desired optical black, carrying out black-and-white development or color development using a coupler-containing developer, and fixing to form said optical black composed of silver or silver and a dye.

6. A process for producing a multicolor optical filter which comprises:

exposing a photographic material comprising one black-and-white silver halide emulsion layer on a base to light to carry out pattern exposure for a first color;

forming a pattern containing a dye of the first color and silver by color development using a coupler-containing developer;

carrying out pattern exposure for a second color, forming a pattern containing a dye of the second color and silver;

repeating, if desired, the same steps for forming a pattern containing a dye to yield third or subsequent colors and silver;

bleaching silver in the patterns to remove the same by dissolution or to convert said silver into a silver compound, to thereby form patterns of at least two colors in said emulsion layer; and finally carrying out pattern exposure corresponding to an optical black, carrying out black-and-white development or color development using a coupler-containing developer, and fixing to form an optical black composed of silver or silver and a dye.

* * * * *